(12) United States Patent
Franken (10) Patent No.: US 7,397,531 B2
(45) Date of Patent: Jul. 8, 2008

(54) LITHOGRAPHIC APPARATUS AND DEVICE MANUFACTURING METHOD

(75) Inventor: Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 167 days.

(21) Appl. No.: 10/960,784

(22) Filed: Oct. 8, 2004

(65) Prior Publication Data

US 2005/0105066 A1   May 19, 2005

(30) Foreign Application Priority Data

Oct. 9, 2003   (EP) ................... 03078191

(51) Int. Cl.
*G03B 27/52* (2006.01)
*G03B 27/68* (2006.01)
*G02B 7/02* (2006.01)

(52) U.S. Cl. ............... 355/30; 355/52; 359/820
(58) Field of Classification Search ......... 355/30, 355/50–53, 55, 67; 359/846, 848, 820
See application file for complete search history.

(56) References Cited

U.S. PATENT DOCUMENTS 3,836,236 A * 9/1974 Kirk et al. ............ 359/845
5,390,228 A * 2/1995 Niibe et al. ............ 378/34
6,846,086 B2 * 1/2005 Goldstein ............ 359/846

2002/0074115 A1 * 6/2002 Dieker .................. 165/201
2003/0169520 A1   9/2003 Goldstein

FOREIGN PATENT DOCUMENTS

| EP | 0 532 236 A1 | 3/1993 |
| EP | 06308294 | * 11/1994 |
| EP | 1 197 803 A2 | 4/2002 |
| JP | 6-308294 | 11/1994 |

OTHER PUBLICATIONS

Natale M. Ceglio, Andrew M. Hawryluk, and Gary E. Sommargren, "Front-end design issues in soft-x-ray projection lithography," Applied Optics, vol. 32 (No. 34), p. 7050-7056, (Dec. 1993).

* cited by examiner

*Primary Examiner*—Hung Henry Nguyen
(74) *Attorney, Agent, or Firm*—Pillsbury Winthrop Shaw Pittman, LLP (57) ABSTRACT

A lithographic apparatus includes an illumination system for providing a beam of radiation, and a support structure for supporting a patterning device. The patterning device serves to impart the projection beam with a pattern in its cross-section. The apparatus also includes a substrate table for holding a substrate, and a projection system for projecting the patterned beam onto a target portion of the substrate. At least one of the patterning device, or the projection system, and the illumination system includes a reflector assembly that includes a reflector substrate with a reflective surface for reflecting part of incident radiation, and a heat exchanger system that is constructed and arranged to exchange heat with the reflector substrate. The heat exchanger system includes a thermally active element that is disposed in a recess of the reflector substrate at a side of the reflector substrate that is different from the reflective surface.

25 Claims, 3 Drawing Sheets

LITHOGRAPHIC APPARATUS AND DEVICE MANUFACTURING METHOD

CROSS-REFERENCE TO RELATED APPLICATIONS

This application claims the benefit of priority from European Patent Application No. 3078191.8, filed Oct. 9, 2003, the entire content of which is incorporated herein by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In general, in the optical system of a lithographic apparatus reflectors, such as mirrors, are used to reflect a beam of radiation, in order to shape or focus the radiation beam. In lithographic apparatus using EUV radiation, mirrors are used, for example, to shape the radiation beam and manipulate the radiation beam otherwise. However, mirrors have limited reflectivity. Thus, not all of the incident radiation is reflected by the mirror but a part of the incident radiation is absorbed by the mirror. The absorbed part of the incident radiation energy is converted into heat, which gives rise to a temperature increase of the mirror. This increase in temperature may have a negative effect, such as an unwanted deformation of the mirror. In a systems using one or more mirrors, the effects of deformation of the mirrors on the optical performance are larger compared to systems using defractive options, such as lenses. Accordingly, in a lithographic apparatus using mirrors, the thermal aspects of the mirror(s) need specific attention.

It is known from the Patent Abstracts of Japan 2002-100551 to provide a reflector with a piezoelectric element that can apply a compensating force to the reflector to correct the thermal deformations. However, the piezoelectric element has the disadvantage that complex and expensive (piezo) electric circuitry has to be provided.

Another manner of counteracting thermal deformation of a reflecting mirror is known from the Patent Abstracts of Japan 2000-036449. In this prior art document, a mirror with heating elements positioned against a back of the mirror is described. The mirror is selectively heated by the heating element, in order to provide a uniform heating of the mirror, and thus reduce thermal deformations of the mirror. However, this solution requires a complex system of control circuits and heating devices to apply an appropriate heating.

Moreover, in both prior art devices, only the local deformation is prevented.

SUMMARY

It is a general aspect of the present invention to provide an improved lithographic apparatus. More specific, it is an aspect of the present invention to provide a lithographic apparatus in which one or more reflector assemblies present in the lithographic apparatus are less susceptible to deformation of the reflector surface due to heat generated by absorption of incident radiation by the reflector.

According to an aspect of the invention, there is provided a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, and a projection system for projecting the patterned beam onto a target portion of the substrate. At least one of the patterning device, the projection system, and the illumination system includes a reflector assembly that includes a reflector substrate with a reflective surface for reflecting at least a part of incident radiation. The reflector assembly further includes a heat exchanger system that is constructed and arranged to exchange heat with the reflector substrate. The heat exchanger system includes at least one thermally active element disposed in at least one recess of the reflector substrate at a side of the reflector substrate that is different from the reflective surface.

The heat generated by radiation incident on the reflective surface has less effect on the reflector assembly, because heat may be transferred from the reflective surface and the substrate by the heat exchanger system.

Moreover, heat may be removed or added close to the reflective surface, before penetrating deep into the substrate, because the at least one thermally active element is present in a recess of the reflector substrate, and the thermally active element therefore lies close to the reflective surface.

According to an embodiment of the invention, at least one of the thermally active elements has a first end near the reflective surface, and a second end further away from the reflective surface than the first end.

Thus, the heat transferred to the thermally active element may be transferred further away from the reflective surface or from a distance from the reflective surface towards the reflective surface, such that effective cooling or heating may be obtained.

According to an embodiment of the invention, at least one of the thermally active elements is capable of transferring heat in a first direction from a first part of the reflective surface opposite to the first end of the thermally active element, and heat into a second direction from a second part of the reflective surface different from the first part. The directions are such that the first and second part deform substantially similarly when radiation is projected on the first part and the second part.

Therefore, heat may be transferred by the thermally active elements from different parts of the reflective surface and local deformations due to heating of the substrate are reduced.

According to an embodiment, a plurality of thermally active elements are used. In such an embodiment, a plurality of recesses in the reflector substrate received the plurality of thermally active elements such that one thermally active element is disposed in one recess.

According to an embodiment of the invention, the first ends of the thermally active elements lie at substantially the same distance from the reflective surface so that the heat flow from the reflective surface towards each of the thermally active elements may be substantially uniform along the reflective surface. Accordingly, temperature differences along the reflective surface, and the thermal deformation thereof, may be reduced.

According to an embodiment of the invention, the first end of the thermally active element has a curved surface which has a concave shape towards the reflective surface.

Because of the curved surface, the combined effect of the area of a thermally active element projecting towards a part of the reflective surface and the (average) distance of the area of the thermally active element towards the point on the reflective surface is less dependent on the point on the reflective surface. Accordingly, the thermal deformation of parts of the reflective surface is less dependent on their position relative to the thermally active elements.

According to an embodiment of the invention, at least one of the thermally active elements has a curved side between the first end and the second end so that the heat transferred from the substrate, as well as deformation caused by the heat, is less dependent on the position in the substrate relative to the thermally active element. Thus, local deformation is reduced.

An embodiment of a lithographic apparatus according to the invention includes at least one first thermally active element capable of generating a first heat flow and at least one second thermally active element capable of generating a second heat flow. The first heat flow and second heat flow differ in at least one aspect, e.g. some parts of the reflective surface may be cooled, whereas other parts thereof may be heated. This way, the deformation of the reflective surface may be controlled locally, and the shape of the reflective surface may be adapted in order to correct for mechanical deformations due to the weight of the reflector, for example.

According to an embodiment of the invention, the heat exchanger system includes a plate-shaped element at a side of the reflector substrate different from the reflective surface. At least two thermally active elements are connected to the plate-shaped element. This way, the entire heat exchanger system may be positioned simply by positioning the plate-shaped elements.

The invention further provides a reflector assembly for a lithographic apparatus. The reflector assembly includes a reflector substrate with a reflective surface for reflecting at least a part of incident radiation, and a heat exchanger system for transferring heat to a part of the reflector substrate. The heat exchanger system includes a thermally active element disposed in a recess of the reflector substrate at a side of the reflector substrate that is different from the reflective surface.

In such a reflector assembly, thermal deformation of the reflective surface may be reduced, because heat may be transferred from the reflective surface before penetrating deep into the substrate because the at least one thermally active element is present in a recess of the reflector substrate and, therefore, lies close to the reflective surface.

Also, the invention provides a heat exchanger system arranged for use in a reflector assembly of a lithographic apparatus. The heat exchanger system includes a thermally active element that is positionable in a recess of a reflector substrate with a reflective surface for reflecting at least a part of incident radiation at a side of the reflector substrate that is different from the reflective surface. Such a heat exchanger system may be used to reduce thermal deformation of a reflector, because heat may be transferred from the reflective surface of the reflector before penetrating deep into the substrate, because the at least one thermally active element is present in a recess of the reflector substrate and, therefore, lies close to the reflective surface.

Furthermore, the invention provides a device manufacturing method that includes patterning a beam of radiation, and projecting the patterned beam of radiation onto a target portion of a substrate. The patterning and/or projecting includes reflecting radiation with a reflector assembly that includes a reflector substrate with a reflective surface for reflecting part of incident radiation, and exchanging heat with the reflector substrate with a heat exchanger system that includes a thermally active element disposed in a recess of the reflector substrate at a side of the reflector substrate that is different from the reflective surface. In such a method, a device may be manufactured with high accuracy, because thermal deformations in the reflector assemblies may be reduced by the heat exchanger system. This way, optical distortions of the beam of radiation may be reduced as well, and the pattern may be projected on the target portion of the substrate accurately.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
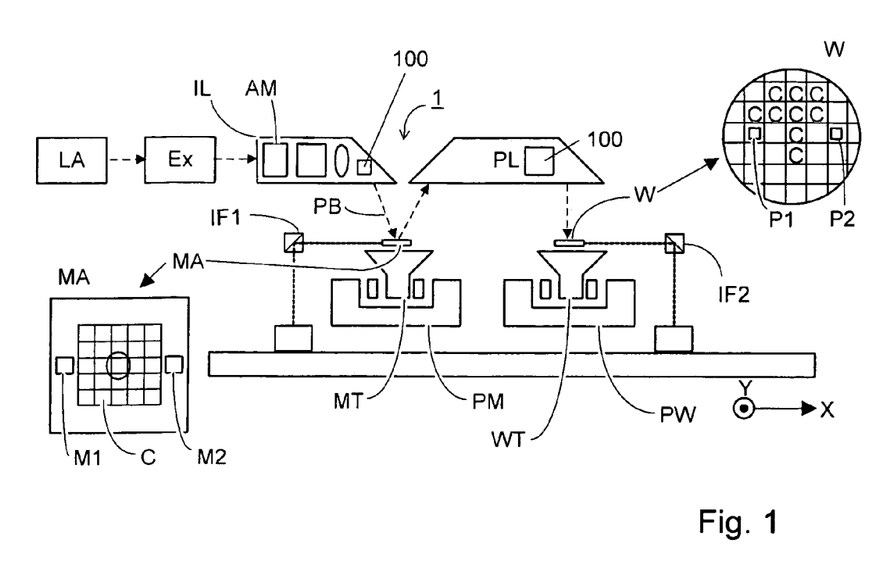
FIG. 1 depicts a lithographic apparatus according to an embodiment of the invention.

FIG. 1 schematically depicts a lithographic apparatus 1 according to a particular embodiment of the invention. The apparatus includes: an illumination system (illuminator) IL for providing a projection beam PB of radiation (e.g. UV or EUV radiation), a first support structure (e.g. a mask table) MT for supporting a patterning device (e.g. a mask) MA and connected to a first positioner PM for accurately positioning the patterning device with respect to item PL, a substrate table (e.g. a wafer table) WT for holding a substrate (e.g. a resist-coated wafer) W and connected to a second positioner PW for accurately positioning the substrate with respect to item PL, and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source LA. The source and the lithographic apparatus may be separate entities, for example when the source is a plasma discharge source. In such cases, the source is not considered to form part of the lithographic apparatus and the radiation beam is generally passed from the source to the illuminator IL with the aid of a radiation collector including for example suitable collecting mirrors and/or a spectral purity filter. In other cases the source may be integral part of the apparatus, for example, when the source is a mercury lamp. The source and the illuminator IL, may be referred to as a radiation system.

The illuminator IL may include an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, e.g. so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
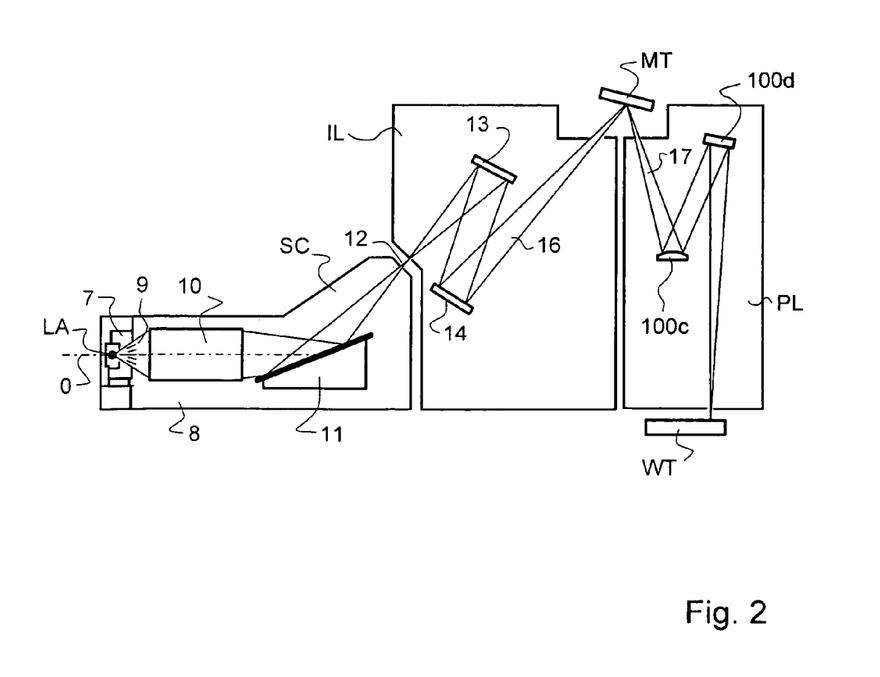
FIG. 2 shows a side view of an EUV illuminating system and projection optics of a lithographic apparatus according to the invention.

FIG. 2 shows the projection system PL and a radiation system that can be used in the example of a lithographic apparatus 1 of FIG. 1. The radiation system includes an illumination system IL. In this example, the radiation system also includes a source-collector module SC. The source-collector module SC is provided with a radiation source LA that may be formed by a discharge plasma. The radiation source LA may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure includes a channel structure such as, for example, described in detail in European patent applications EP-A-1 233 468 and EP-A-1 057 079, which are incorporated herein by reference.

The collector chamber 8 includes a radiation collector 10 that can be formed by a grazing incidence collector. Radiation passed by collector 10 is reflected off a grating spectral filter 11 to be focused in a virtual source point 12 at an aperture in the collector chamber 8. From chamber 8, the projection beam 16 is reflected in illumination system IL via normal incidence reflectors 13, 14 onto a reticle or mask positioned on reticle or mask table MT. A patterned beam 17 is formed, which is imaged in projection system PL via reflective elements 100c, 100d onto a wafer stage or substrate table WT.

More elements than shown may generally be present in the illumination system IL and the projection system PL. The lithographic apparatus may include more or less reflectors or reflective elements than the example of FIGS. 1 and 2. The normal incidence reflectors 13,14 and the reflective elements 100c, 100d may be implemented as a reflector assembly according to the invention, such as, the embodiment of FIG. 3. Furthermore, it is possible to implement one or more of the reflectors or reflective elements in a different manner, for example, depending on the requirements of the specific implementation.

In the embodiment shown in FIG. 2, the reflective elements 100c, 100d in the projection system PL are implemented as a reflector assembly according to the invention. Especially in the projection system PL, the optical accuracy needs to meet stringent requirements. The pattern in the mask needs to be projected accurately. The beam of radiation in the projection system reflects the pattern in the mask and needs a large degree of accuracy as well. Thus, a reflector assembly according to the invention is particularly suitable for, but not limited to, use in the projection system PL, because such a reflector assembly is less susceptible to thermal deformation and therefore has a good optical accuracy. The reflector assembly in the projection system PL may, for example, be implemented according to the example of a reflector assembly of FIG. 3.

Figure 3:
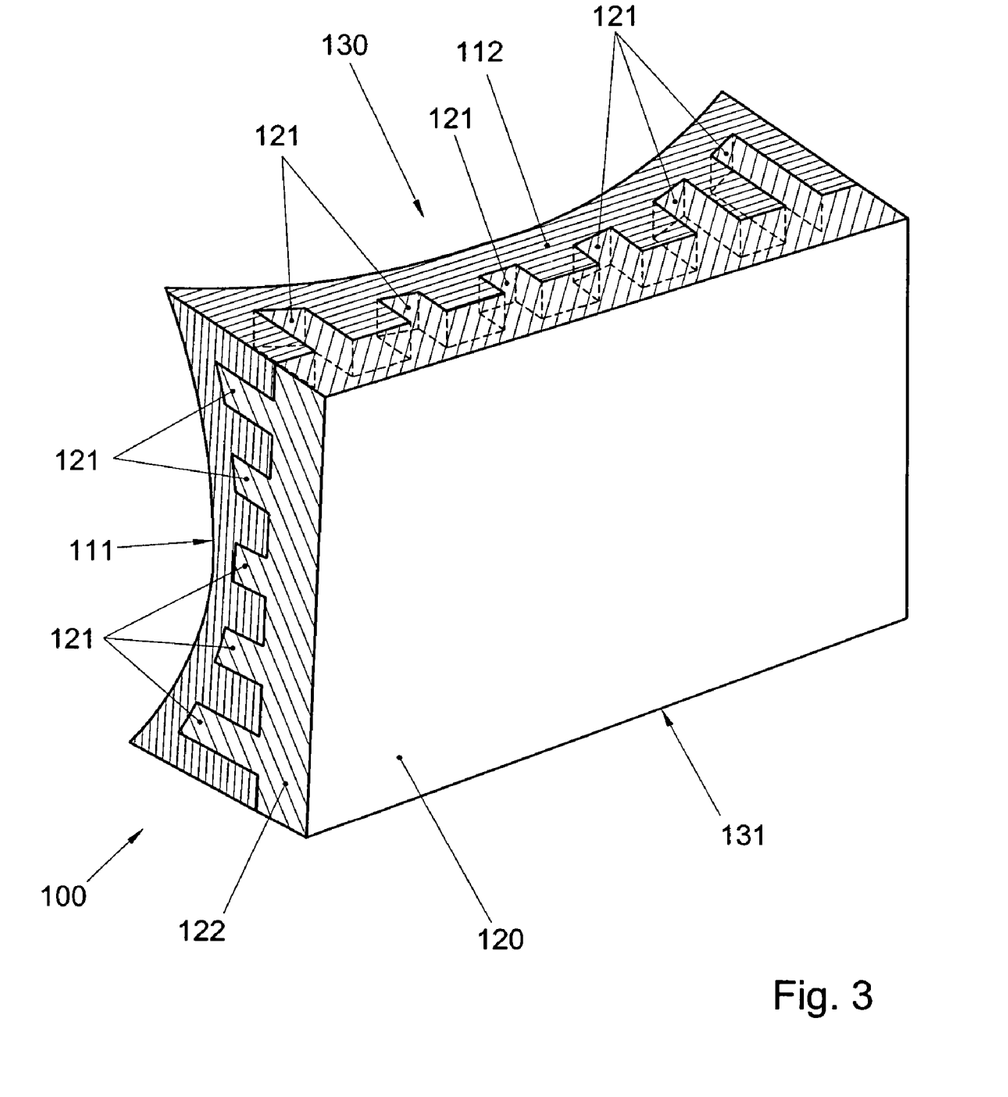
FIG. 3 shows a perspective view of an embodiment of a reflector assembly according to the invention.

The embodiment of a reflector 100 in FIG. 3 includes a substrate 112 with a reflective surface 111 at a first side, from hereon referred to as the front-side 130 of the reflector 100. The reflective surface 111 reflects incident radiation, such as EUV. The reflective surface 111 has a curved shape, in this example a concave shape, however it is also possible to use a convex surface, a facetted surface, a flat surface or otherwise as a reflective surface.

The reflector 100 is provided with a heat exchanger system 120 capable of exchanging heat with, e.g. from or to, at least a part of the reflector substrate 112. In this example, the heat exchanger system includes a cooling system capable of removing heat from parts of the reflective surface 111 via the substrate 112 to the heat exchanger system. However, the heat exchanger system may include a heating system capable of adding heat to at least a part of the reflector substrate 112 or the reflective surface 111, or may be a combination of heating and cooling systems. Thus, the term "heat exchanger system" as used herein should be considered to broadly refer to whichever system is being used to remove heat from (cooling system) or add heat to (heating system) parts of the reflective surface 111.

In the illustrated embodiment, the heat exchanger system 120 is provided at a backside 131 of the reflector, i.e. the side opposite to the reflective surface 111. The heat exchanger system 120 includes a plate-shaped element 122 with a number of thermally active elements 121, which extend into recesses 113 in the substrate 112, as is shown in more detail in the examples of FIGS. 4 and 5. The thermally active elements 121 each have an elongated, finger-like shape with a first end 123 towards the reflective surface 111, which may be referred to as the free end of a thermally active element or the 'tip' of a finger shaped thermally active element, a second end 124 further away from the reflective surface 111 than the first end 123, and a length between the first end 123 and the second end 124.

The second ends 124 of the thermally active elements 121 may be referred to as the fixed end, at which different thermally active elements are connected to each other by means of the plate-shaped element 122, as shown in FIG. 3. The thermally active elements 121 extend in recesses 113 in the substrate 112. Thus, the first ends 123 lie close to the reflective surface 111 so that the thermal resistivity between the first and the reflective surface is low. Accordingly, heat generated by incident radiation at the reflective surface 111 reaches the thermally active elements 121 in a relatively short time period compared to thermally active elements positioned outside the recesses. Hence, the generated heat is removed quickly via the thermally active elements 121. Accordingly, thermal deformation of the overall reflective surface may be reduced.

Figure 4:
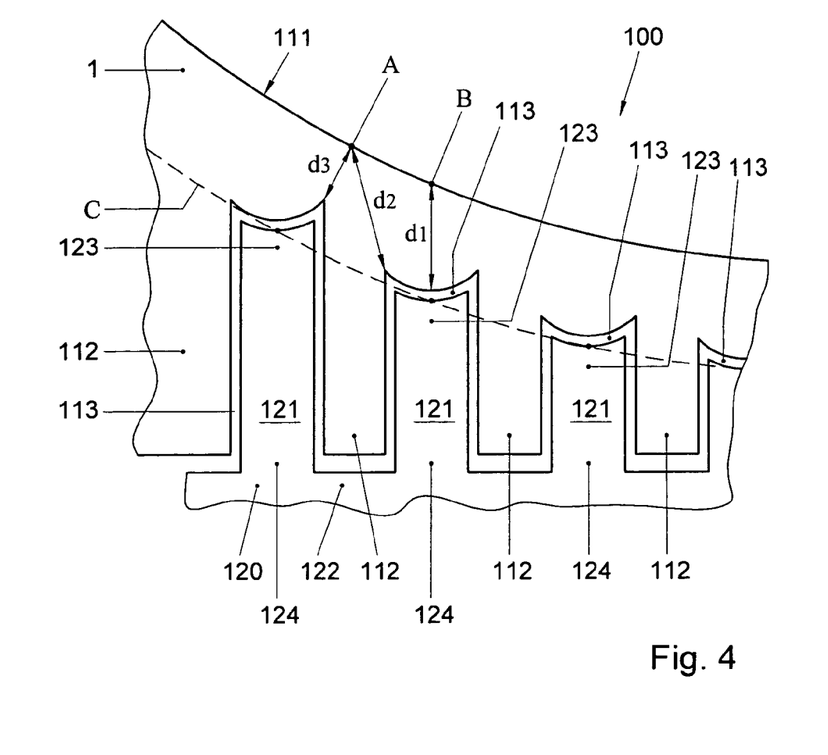
FIG. 4 shows a cross-sectional view of a part of an embodiment of a reflector assembly according to the invention.
Figure 5:
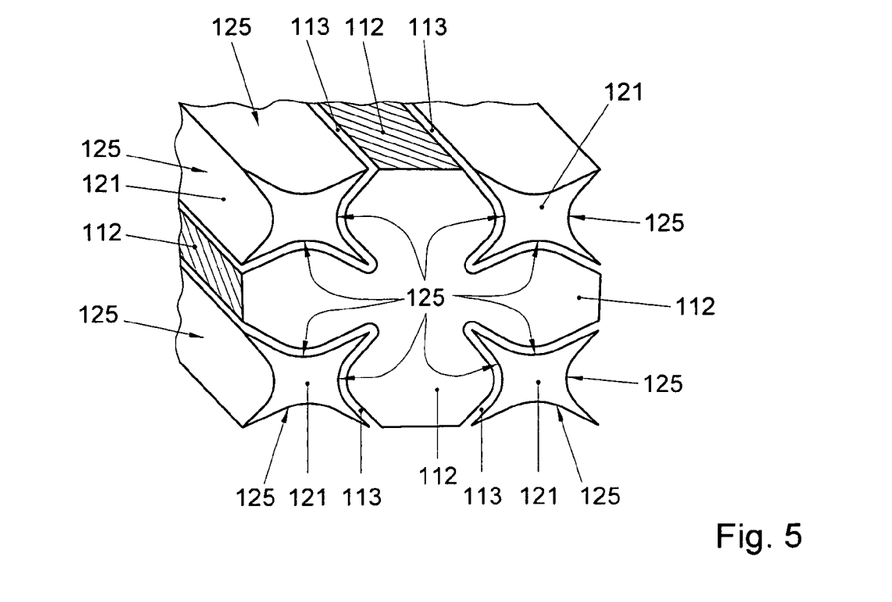
FIG. 5 shows a cross-sectional view of a part of an embodiment of a reflector assembly according to the invention.

In the embodiments shown in FIGS. 3-5, the substrate 112 and the heat exchanger system 120 are positioned at a distance with respect to each other. Therefore, a spacing is present between the thermally active elements 121 and the substrate 112, as is shown in FIGS. 4 and 5. The thermally active elements 121 and the substrate 112 are therefore physically not in contact which each other, but the heat exchanger system 120 and the substrate 112 are thermally coupled, because heat may be transferred by means of radiation between the heat exchanger system 120 and the substrate 112 or, in case a fluid, e.g. a (purge) gas, is present between the thermally active elements 121 and the substrate 112, by means of convection.

The heat exchanger system 120 may, for example, be connected mechanically to other parts of the lithographic apparatus 1, while the substrate 112 is kept in position relative to the heat exchanger system 120 by means of a non-mechanical, e.g. an electric, electro-magnetic or magnetic, sensor-actuator system, as is generally known in the art of lithographic apparatus. The sensor-actuator system may, for example, include one or more Lorentz actuators and one or more sensors connected to each other by means of a Single Input Single Output (SISO) control circuit, each combination of actuator, sensor and SISO control circuit controlling the position of the substrate 112 relative to the heat exchanger system in one degree of freedom. However, other positioners may likewise be used to position the components of a reflector 100 according to the invention.

The reflector 100 may have any suitable shape and dimensions. Likewise, the substrate 112 may be made of any material suitable for the specific implementation. For example, a material suitable for use in lithographic apparatus using (extreme) ultraviolet radiation is a glass ceramic material, such as the material sold under the name ZERODUR® by Schott Glaswerke of Mainz, Germany. In general, glass ceramic materials, and ZERODUR® in particular, have a low thermal expansion coefficient. Thus, a reflector with a substrate of glass ceramic, e.g. ZERODUR®, is especially suited for applications with stringent requirements on deviations of the reflective surface under differing conditions. Such applications may be lithographic projection using Deep Ultra Violet (DUV) or EUV electromagnetic radiation, for example. However, a draw-back of glass ceramics, and ZERODUR® in particular, is that these materials in general have a low thermal conductivity. Thus, the cooling or heating should preferably occur as close to the reflective surface as possible. The thermally active elements of a reflector according to the invention are therefore particularly suited for use with reflectors of such materials. In general, reflectors for DUV or EUV electromagnetic radiation are multilayer reflectors that include a layered structure. Such multi-layer reflectors are generally known in the art of lithographic projecting. Projecting systems with multi-layer reflectors are also generally known in the art of lithographic projecting.

In general, a finger-shaped thermally active element generates a heat flow in the prolongation of the thermally active elements 121 due to a temperature difference between the thermally active element 121 and the reflective surface 111, i.e. towards the part of the reflective surface 111 directly opposite to a thermally active element only. Accordingly, when radiation is projected onto the reflective surface 111, the parts of the reflective surface opposite to the spacing between the thermally active elements 121 will warm up differently than the parts of the reflective surface 111 directly opposite to a thermally active element 121 because of the differences in the effective heat transfer by the thermally active elements 121 for those different parts of the reflective surface 111.

Especially, but not limited to, reflectors with a glass-ceramic substrate, e.g. ZERODUR®, the low thermal conductivity may cause differences in temperature (also referred to as volumetric temperature inhomogeneity) of different parts of the reflector if the heat transfer is not homogeneous along or parallel to the surface (i.e. the temperature and thermal expansion may then be different in the prolongation of the 'fingers' and the other parts of the reflector substrate). The differences in temperature may cause differences in thermal deformation along the reflective surface. Accordingly, the differences may affect the optical characteristics of the reflector. Typically, those differences in deformation are of a scale in the same order as the distance between the thermally active elements 121.

In the examples of FIGS. 4-5, the shape of the thermally active elements 121 is such that the thermally active elements 121 may induce heat flow in a first direction from a part of the reflective surface opposite to the first end of the thermally active element 121 and heat flow into a second direction from a part of the reflective surface opposite to a spacing between successive thermally active elements. The amount and directions of the heat flow may be made such that the parts of the reflective surface 111 deform substantially similarly when radiation is projected on the different parts of the reflective surface 111.

For example, the thermally active elements 121 may be adjusted to modulate the volumetric temperature inhomogeneity, in order to achieve a minimized deformation of the reflective surface. For example, the distance of the surface of the thermally active elements from the reflective surface may be modulated. However, other properties of the shape may be modulated such as the shape of the surface of each thermally active element and/or the cross-sectional area of the thermally active elements and/or the length and/or the side surface of the thermally active elements and/or otherwise.

Modulating may, for example, be done by decreasing and increasing local heat transfer in such a way as to tailor a resulting internal volumetric temperature distribution which is uniform at the reflective surface. Any internal temperature differences will result in parts of the substrate to be loaded by positive (compression) stresses, while other parts will feel negative (tensile) stresses. These (little) stress (sub-)volumes may be induced by the shape of the thermally active elements 121 such that the stress volumes cancel each other's effect, to the extent that the differences in local deformation of the reflective surface 111 may be minimized.

For example, as shown in FIG. 4, the first ends 123 of the thermally active elements 121 all lie at substantially the same distance from the reflective surface 111. In the example of FIG. 4, an imaginary line (dashed line C in FIG. 4) through the first ends 123 has substantially the same shape as the reflective surface 111. Thus, the heat removal rate from the reflective surface 111 will be substantially uniform along the reflective surface 111 for each of the thermally active elements 121. Accordingly, temperature differences along the reflective surface and the thermal deformation thereof may be reduced. However, the thermally active elements 121 may likewise have different shapes and the first ends 123 of the thermally active elements 121 may lie at different distances from the reflective surface 111.

In the example of FIG. 4, the first ends 123 of the thermally active elements 121 are shaped such that one or more of the factors that cause inhomogeneous heat transfer along the reflective surface 111 are compensated to some extent and thus temperature differences and thermal deformation along the reflective surface 111 may be further reduced. In this example, the first ends 123 are provided with a curved surface, e.g. a concave surface with its open side facing towards the reflective surface 111. Because of this curvature, the combined effect of the area of a thermally active element 121 projecting towards a part of the reflective surface 111 and the (average) distance of the area of the thermally active element towards the point on the reflective surface is less dependent on the point on the reflective surface 111. Accordingly, the thermal deformation of parts of the reflective surface 111 is less dependent on their position relative to the thermally active elements 121, i.e. whether the parts are along the prolongation of the thermally active elements 121 or are opposite to the spacing between the thermally active elements 121.

As is indicated with arrows $d_2$ and $d_3$ the distances between a point A on the reflective surface 111 which lies between two thermally active elements 121 and these thermally active elements 121 is different. However, due to the concave curvature, the average distance between point A and both thermally active elements 121, which in this case may be roughly approximated as equal to $(d_2+d_3)/2$, is more similar to the distance $d_1$ from point B on the reflective surface 111. Point B lies in front of a thermally active element 121. Hence, the average distance between the first ends 123 of the thermally active elements 121 and different parts of the reflective surface 111 is more uniform along the surface, so that uniformity of the heat removal rate may be further increased. Because the heat removal rate is more uniform, temperature differences along the reflective surface 111 and corresponding differences in thermal deformation may be prevented.

In the embodiment shown in FIG. 4, the shape of the free ends 123 is adapted by taking into account two factors that affect the heat removal rate, such as projected area and (average) distance. However, the shape of the free ends 123 or other parts of the thermally active elements 121 may likewise be adapted to compensate for differences along the reflective surface 111 in one or more other factors, or a different combination thereof, which influence the thermal deformation.

The thermally active elements 121 may also be provided with a curved surface at their longitudinal side 125, i.e., the surface along the length between the first end 123 and the second end 124 may be curved as well. As shown in the embodiment of FIG. 5, the longitudinal sides of the thermally active elements are curved in a direction transverse to the longitudinal direction from the first end 123 to the second end 124. In FIG. 5, the curved longitudinal side are concave-shaped the open side facing away from the respective thermally active element 121.

It should be noted that the above-mentioned embodiments illustrate rather than limit the invention, and that those skilled in the art will be able to design alternatives and variations without departing from the scope of the appended claims.

For example, the heat may be transferred in any manner suitable for the specific implementation. For example, the inside of the thermally active elements may be provided with fluid channels in which a cooling fluid or a heating fluid may flow to transfer heat from or to the thermally active elements. In such a case, the fluid may be water or air, for example.

Likewise, the plate-shaped element may be actively cooled or heated and be provided with cooling or heating devices and the finger-shaped elements may be cooled or heated via a thermal connection between the plate-shaped element and the thermally active elements.

Furthermore, the heat flow may differ for some of the thermally active elements and/or be controlled by a heat transfer control, for example, by means of a flow control for adjusting the flow of a fluid flowing inside the finger shaped elements or a fluid temperature control device for changing the temperature of the fluid. The fluid temperature control device may be, for example, an electrical conducting coil that may control the temperature of the fluid and be connectable to a controllable power source.

Via control of the local heat transfer, the deformation of the reflective surface can be controlled locally and the shape of the reflective surface can be adapted, in order to correct for mechanical deformations due to the weight of the reflector, for example.

In addition, the heat exchanger system may be provided to any reflector of a lithographic apparatus, such as a mirror, a mask, or other reflectors, such as, in case the lithographic apparatus is of the so-called 'maskless type', a programmable mirror array, or other programmable patterning devices.

While specific embodiments of the invention have been described above, it will be appreciated that the invention may be practiced otherwise than as described. The description is not intended to limit the invention.

What is claimed is:

1. A lithographic apparatus comprising:
   an illumination system for providing a beam of radiation;
   a support structure for supporting a patterning device, the patterning device serving to impart the projection beam with a pattern in its cross-section;
   a substrate table for holding a substrate; and
   a projection system for projecting the patterned beam onto a target portion of the substrate,
   wherein at least one of the patterning device, the projection system, or the illumination system comprises a reflector assembly comprising
      a reflector substrate with a reflective surface for reflecting part of incident radiation and a recess in a backside of the reflector substrate that is opposite the reflective surface; and
      a heat exchanger system constructed and arranged to exchange heat with the reflector substrate, the heat exchanger system comprising a thermally active element that extends into the recess of the reflector substrate.

2. A lithographic apparatus as claimed in claim 1, wherein the thermally active element has a first end near the reflective surface, and a second end further away from the reflective surface than the first end.

3. A lithographic apparatus as claimed in claim 2, wherein the first end has a curved surface with a concave shape towards the reflective surface.

4. A lithographic apparatus as claimed in claim 2, wherein the thermally active element has a curved side between the first end and the second end.

5. A lithographic apparatus as claimed claim 2, wherein the thermally active element is capable of transferring heat in a first direction from a first part of the reflective surface opposite to the first end of the thermally active element, and heat into a second direction from a second part of the reflective surface that is different from the first part, the directions being such that the first part and the second part deform substantially similarly when radiation is projected on the first part and the second part.

6. A lithographic apparatus as claimed in claim 1, wherein the heat exchanger system comprises a plurality of thermally active elements, each extending into a respective recess of the reflector substrate in the backside of the reflector substrate.

7. A lithographic apparatus as claimed in claim 6, wherein a first end of each of the plurality of thermally active elements lie at substantially the same distance from the reflective surface.

8. A lithographic apparatus as claimed in claim 6, wherein the plurality of thermally active elements comprises a first thermally active element for generating a first heat flow and a second thermally active element for generating a second heat flow, wherein the first heat flow and the second heat flow are different.

9. A lithographic apparatus as claimed in claim 1, wherein the heat exchanger system comprises a plate-shaped element at the backside of the reflector substrate, wherein a plurality of thermally active elements are connected to the plate-shaped element.

10. A lithographic apparatus as claimed in claim 1, wherein the heat exchanger system comprises a plurality of thermally active elements, and wherein a distance between the reflective surface and first ends of each of the thermally active elements is substantially the same.

11. A lithographic apparatus as claimed in claim 1, wherein the heat exchanger system is a cooling system.

12. A lithographic apparatus as claimed in claim 1, wherein the heat exchanger system is a heating system.

13. A reflector assembly for a lithographic apparatus, the reflector assembly comprising:
   a reflector substrate with a reflective surface for reflecting at least a part of incident radiation and a recess in a backside of the reflector substrate that is opposite the reflective surface; and
   a heat exchanger system constructed and arranged to exchange heat with the reflector substrate, the heat exchanger system comprising a thermally active element that extends into the recess of the reflector substrate.

14. A reflector assembly as claimed in claim 13, wherein the heat exchanger system comprises a plurality of thermally active elements, each extending into a respective recess of the reflector substrate at the backside of the reflector substrate.

15. A reflector assembly as claimed in claim 13, wherein the heat exchanger system is a cooling system.

16. A reflector assembly as claimed in claim 13, wherein the heat exchanger system is a heating system.

17. A heat exchanger system arranged for use in a reflector assembly of a lithographic apparatus, said heat exchanger system comprising a thermally active element positionable in a recess in a backside of a reflector substrate, the reflector substrate having a reflective surface for reflecting part of incident radiation, said backside of the reflector substrate being opposite the reflective surface.

18. A heat exchanger system as claimed in claim 17, wherein the heat exchanger system comprises a cooling system.

19. A heat exchanger system as claimed in claim 17, wherein the heat exchanger system comprises a heating system.

20. A device manufacturing method comprising:
   patterning a beam of radiation;
   projecting the patterned beam of radiation onto a target portion of a substrate,
   wherein said patterning and/or said projecting comprises reflecting radiation with a reflector assembly comprising a reflector substrate with a reflective surface for reflecting part of incident radiation and a recess in a backside of the reflector substrate that is opposite the reflective surface, and exchanging heat with the reflector substrate with a heat exchanger system comprising a thermally active element that extends into the recess of the reflector substrate.

21. A device manufacturing method as claimed in claim 20, wherein said exchanging heat comprises transferring heat away from the reflector substrate.

22. A device manufacturing method as claimed in claim 20, wherein said exchanging heat comprises transferring heat to the reflector substrate.

23. A lithographic apparatus comprising:
   an illumination system for providing a beam of radiation;
   a support structure for supporting a patterning device, the patterning device serving to impart the projection beam with a pattern in its cross-section;
   a substrate table for holding a substrate; and
   a projection system for projecting the patterned beam onto a target portion of the substrate,
   wherein at least one of the patterning device, the projection system or the illumination system comprises a reflector assembly comprising
   a reflector substrate with a reflective surface for reflecting part of incident radiation and a recess in a backside of the reflector substrate that is opposite the reflective surface; and
   a heat exchanger system constructed and arranged to exchange heat with the reflector substrate, the heat exchanger system comprising a thermally active element that extends into the recess of the reflector substrate, the thermally active element having at least one curved surface.

24. A lithographic apparatus as claimed in claim 23, wherein the curved surface has a concave shape towards the reflective surface.

25. A lithographic apparatus as claimed in claim 23, wherein the thermally active element has a first end near the reflective surface, and a second end further away from the reflective surface than the first end, and the curved surface is located between the first end and the second end.

* * * * *